(12) United States Patent
Lin et al.

(10) Patent No.: US 11,968,843 B2
(45) Date of Patent: Apr. 23, 2024

(54) PROCESSING CORE AND MRAM MEMORY UNIT INTEGRATED ON A SINGLE CHIP

(71) Applicant: Taiwan Semiconductor Manufacturing Co., Ltd., Hsinchu (TW)

(72) Inventors: Chung-Te Lin, Tainan (TW); Yen-Chung Ho, Hsinchu (TW); Pin-Cheng Hsu, Zhubei (TW); Han-Ting Tsai, Kaoshiung (TW); Katherine Chiang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/270,484

(22) Filed: Feb. 7, 2019

(65) Prior Publication Data
US 2020/0006423 A1    Jan. 2, 2020

Related U.S. Application Data

(60) Provisional application No. 62/691,498, filed on Jun. 28, 2018.

(51) Int. Cl.
*G06F 3/00*  (2006.01)
*G06F 3/06*  (2006.01)
(Continued)

(52) U.S. Cl.
CPC ........... *H10B 61/20* (2023.02); *G06F 3/0604* (2013.01); *G06F 3/0659* (2013.01);
(Continued)

(58) Field of Classification Search
CPC .... G06F 3/0604; G06F 3/0659; G06F 3/0673; G11C 11/161; G11C 11/1653;
(Continued)

(56) References Cited

U.S. PATENT DOCUMENTS 7,023,726 B1 *  4/2006  Chen ................... G11C 11/15
                                                    365/158
2010/0318761 A1 * 12/2010  Moyer ................ G06F 12/0284
                                                    711/207
(Continued)

FOREIGN PATENT DOCUMENTS

CN    104871248 A    8/2015
CN    105527889 A    4/2016
(Continued)

OTHER PUBLICATIONS

Oboril et al., Evaluation of Hybrid Memory Technologies Using SOT-MRAM for On-Chip Cache Hierarchy, Mar. 2015, IEEE, vol. 34, No. 3, p. 2 (Year: 2015).*

*Primary Examiner* — Reginald G Bragdon
*Assistant Examiner* — Michael L Westbrook
(74) *Attorney, Agent, or Firm* — Seed IP Law Group LLP

(57) ABSTRACT

An embodiment of an integrated circuit chip includes a combination processing core and magnetoresistive random access memory (MRAM) circuitry integrated into the chip. The MRAM circuitry includes a plurality of MRAM cells. The MRAM cells are organized into a number of memories, including a cache memory, a main or working memory and an optional secondary storage memory. The cache memory includes multiple cache levels.

19 Claims, 12 Drawing Sheets

(51) Int. Cl.
*G11C 11/16* (2006.01)
*H10B 61/00* (2023.01)
*H10N 50/01* (2023.01)
*H10N 50/80* (2023.01)

(52) U.S. Cl.
CPC .......... *G06F 3/0673* (2013.01); *G11C 11/161* (2013.01); *G11C 11/1653* (2013.01); *G11C 11/1673* (2013.01); *G11C 11/1675* (2013.01); *H10N 50/01* (2023.02); *H10N 50/80* (2023.02)

(58) Field of Classification Search
CPC ............. G11C 11/1673; G11C 11/1675; H01L 27/226; H01L 43/02; H01L 43/12
See application file for complete search history.

(56) References Cited

U.S. PATENT DOCUMENTS

| | | | | |
|---|---|---|---|---|
| 2013/0044538 A1* | 2/2013 | Oh | ....................... | H01L 27/224 365/158 |
| 2013/0279244 A1* | 10/2013 | Kang | ................... | G11C 11/1693 365/158 |
| 2014/0177325 A1* | 6/2014 | Dong | ...................... | G11C 11/16 365/158 |
| 2014/0297920 A1* | 10/2014 | Takeda | .................. | G06F 15/167 711/102 |
| 2016/0048447 A1* | 2/2016 | Solihin | ................. | G06F 12/123 711/104 |
| 2016/0267957 A1 | 9/2016 | Lu et al. | | |
| 2017/0220487 A1* | 8/2017 | Jung | .................... | G06F 12/1408 |
| 2018/0081555 A1* | 3/2018 | Noguchi | ............. | G06F 12/0292 |
| 2019/0066746 A1* | 2/2019 | Li | ....................... | H01F 10/3295 |

FOREIGN PATENT DOCUMENTS

| | | |
|---|---|---|
| DE | 69231500 T2 | 5/2001 |
| KR | 20130019207 A | 2/2013 |
| KR | 20170092177 A | 8/2017 |
| TW | 201104427 A | 2/2011 |
| TW | 201324148 A | 6/2013 |

* cited by examiner

PROCESSING CORE AND MRAM MEMORY UNIT INTEGRATED ON A SINGLE CHIP

BACKGROUND

The present disclosure generally relates to computing systems and devices, such as, for example, cell phones, personal computing devices, watches, televisions, etc. Such devices typically include one or more processors coupled to one or more memories, such as various levels of cache memory, a main working memory, and secondary storage.

A processor typically is implemented on an integrated circuit and may include one or more processing cores and one or more level-2 and level-3 cache memories. The level-1, level-2 and level-3 caches typically may be implemented using static random access memory (SRAM). A level-1 cache typically may have a response time of under a nano-second. Level-2 and level-3 cache typically may have a response time of 3-10 nano-seconds.

A processor typically is coupled through a bus system to a separate main, or working, memory. The main memory typically may be implemented using dynamic random access memory (DRAM) on one or more DRAM chips. DRAM typically may have a response time of 10-30 nano-seconds.

The processor, the main memory, or both, typically are coupled to a separate secondary or storage memory through a system bus. The storage memory may comprise, for example, a solid state drive (SSD), a hard disk, a flash memory, etc., or various combinations thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
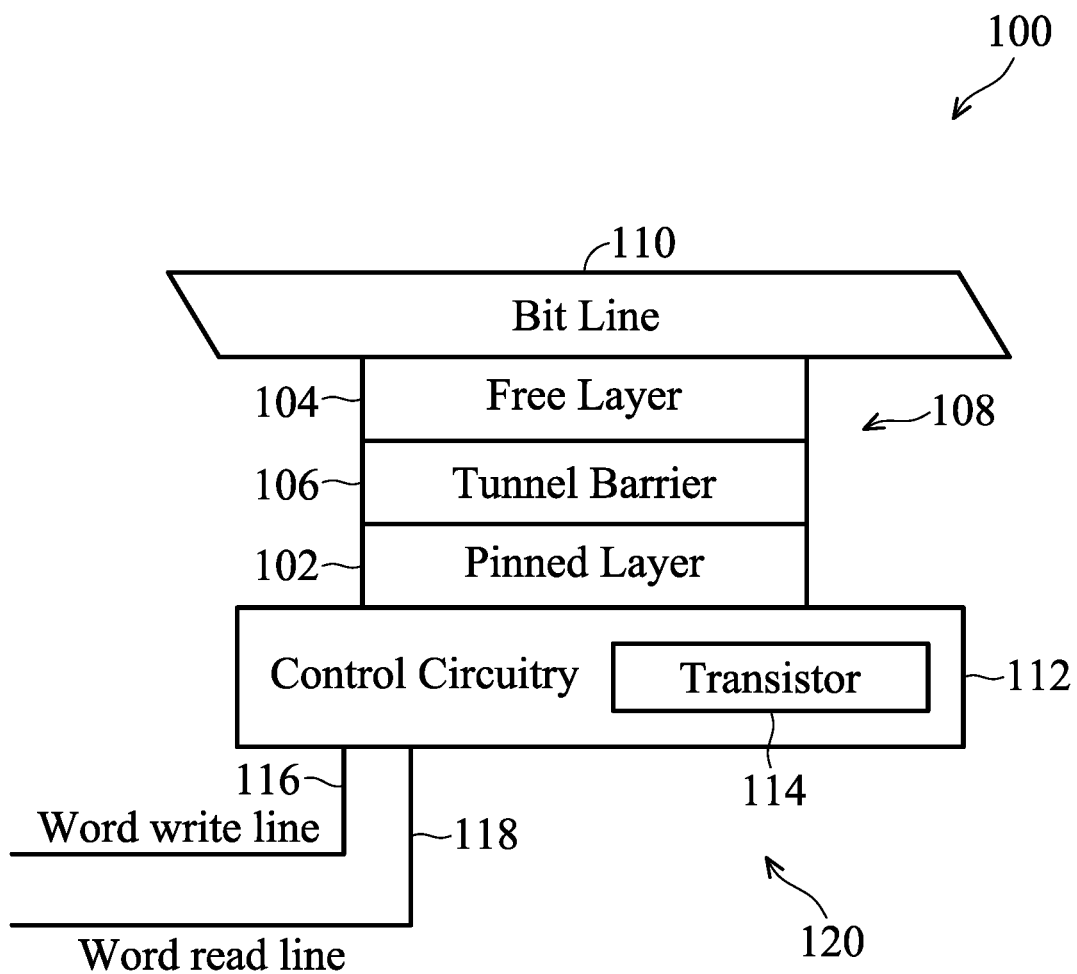
FIG. 1 illustrates a magnetoresistive random access memory (MRAM) cell in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a simplified functional block diagram of an example embodiment of a magnetoresistive random access memory (MRAM) cell 100 formed in a substrate 120. The MRAM cell 100 comprises a fixed or pinned magnetic layer 102 and a free magnetic layer 104 separated by a tunnel barrier 106. The pinned magnetic layer 102, the free magnetic layer 104 and the tunnel barrier 106 form a magnetic tunnel junction 108. The magnetic state of the pinned magnetic layer 102 is fixed. The magnetic state of the free magnetic layer 104 is changed to store a data bit.

As illustrated, the MRAM cell 100 is coupled to a bit line 110 and to control circuitry 112, which may include one or more transistors 114. The transistors 114 may, for example, comprise one or more complementary metal-oxide-semiconductor (CMOS) transistors. Some embodiments may not include a transistor. The control circuitry 112 is coupled to a word write line 116 and to a word read line 118. The control circuitry 112 controls reading from and writing to the MRAM cell 100 based on signals on the bit line 110, the word write line 116 and the word read line 118.

The MRAM cell 100 is programmed by setting a magnetic field alignment of the free layer 104 with respect to the pinned layer 102. The MRAM cell 100 has a different resistance across the tunnel barrier 106 depending on whether the alignment of the free layer 104 and the pinned layer 102 is parallel or antiparallel. An indication of the resistance can be sensed to determine the value stored in the MRAM cell (e.g., 0 or 1). Voltage or current sensor techniques may be employed. For example, a constant current can be supplied to the MRAM cell and a reference cell (not shown), and the voltages across the MRAM cell 100 and the reference cell may be compared to determine the value stored in the MRAM cell 100. The resistance of an MRAM cell 100 is generally high.

MRAM intrinsically has a high resistance performance, and can be designed as a high-resistance device without requiring the addition of a high-resistance block. For non-MRAM memory, to achieve high-resistance performance, a high resistance device may need to be added to the device, which in addition to consuming area, may result in additional processing steps. In contrast, MRAM implementing the various memories may provide high-resistance performance without a separate resistance block, and may be implemented using a single MRAM processing procedure (which may involve multiple processing steps). Separate memories on separate chips using separate processing procedures need not be employed. Thus, an integrated MRAM system may use a simpler process, less area, have a lower production cost, and use fewer interconnections between chips.

Figure 2:
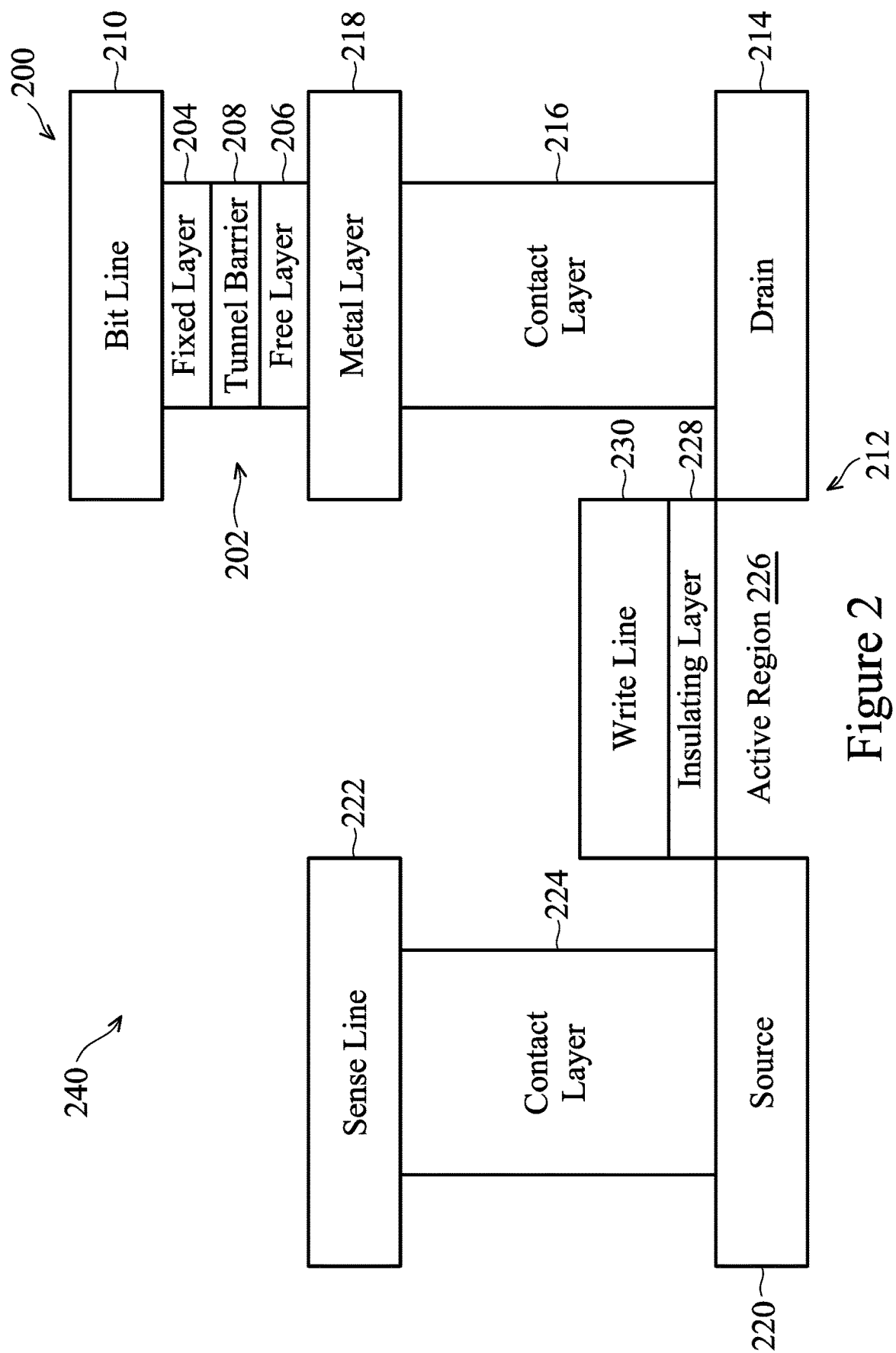
FIG. 2 illustrates a spin-transfer-torque magnetoresistive random access memory (STT-MRAM) cell in accordance with some embodiments.

FIG. 2 is a simplified functional block diagram of an example embodiment of a spin-transfer-torque magnetoresistive random access memory (STT-MRAM) cell 200 with a reverse connection magnetic tunnel junction 202 formed in a substrate 240. The MRAM cell 200 comprises a fixed or pinned magnetic layer 204 and a free magnetic layer 206 separated by a tunnel barrier 208. The pinned magnetic layer 204, the free magnetic layer 206 and the tunnel barrier 208 form the magnetic tunnel junction 202. The magnetic state of the pinned magnetic layer 204 is fixed. The magnetic state of the free magnetic layer 206 is changed to store a data bit.

As illustrated, the MRAM cell 200 is coupled to a bit line 210 and to a control transistor 212, which as illustrated comprises a drain region 214 coupled to the free layer 206 through a contact layer 216 and a metal layer 218. The transistor 212 also comprises a source region 220 coupled to a sense line 222 through a contact layer 224. The transistor 212 has an active region 226 which is separated by a gate insulating layer 228 from a write line 230. The transistor 212 may, for example, comprise a complementary metal-oxide-semiconductor (CMOS) transistor. Reading from and writing to the MRAM cell 200 is controlled based on signals on the bit line 210, the write line 230 and the sense line 222. The MRAM cell 200 is programmed by setting a magnetic field alignment of the free layer 206 with respect to the pinned layer 204.

Embodiments of the MRAM cell 200 of FIG. 2 may have fewer components than illustrated, may have more components than illustrated, may combine or separate illustrated components, and may re-arrange the illustrated components. For example, the magnetic tunnel junction 202 may not be a reverse connection magnetic tunnel junction in some embodiments, and the various lines may have different configurations.

An MRAM (see MRAM 360 of FIG. 3) comprises a plurality of MRAM cells, such as the MRAM cells 100 of FIG. 1 or the MRAM cells 200 of FIG. 2. Other types of MRAM cells may be employed in an MRAM, including various combinations of MRAM cells. MRAM cells are fast like SRAM, can be densely fabricated like DRAM, are non-volatile, like flash memory, and generally have high resistance and low power consumption. For example, the refreshing required by volatile DRAM may require a significant amount of power, while MRAM does not require refreshing. In addition, writing to flash memory generally requires more power than writing to MRAM.

Figure 3:
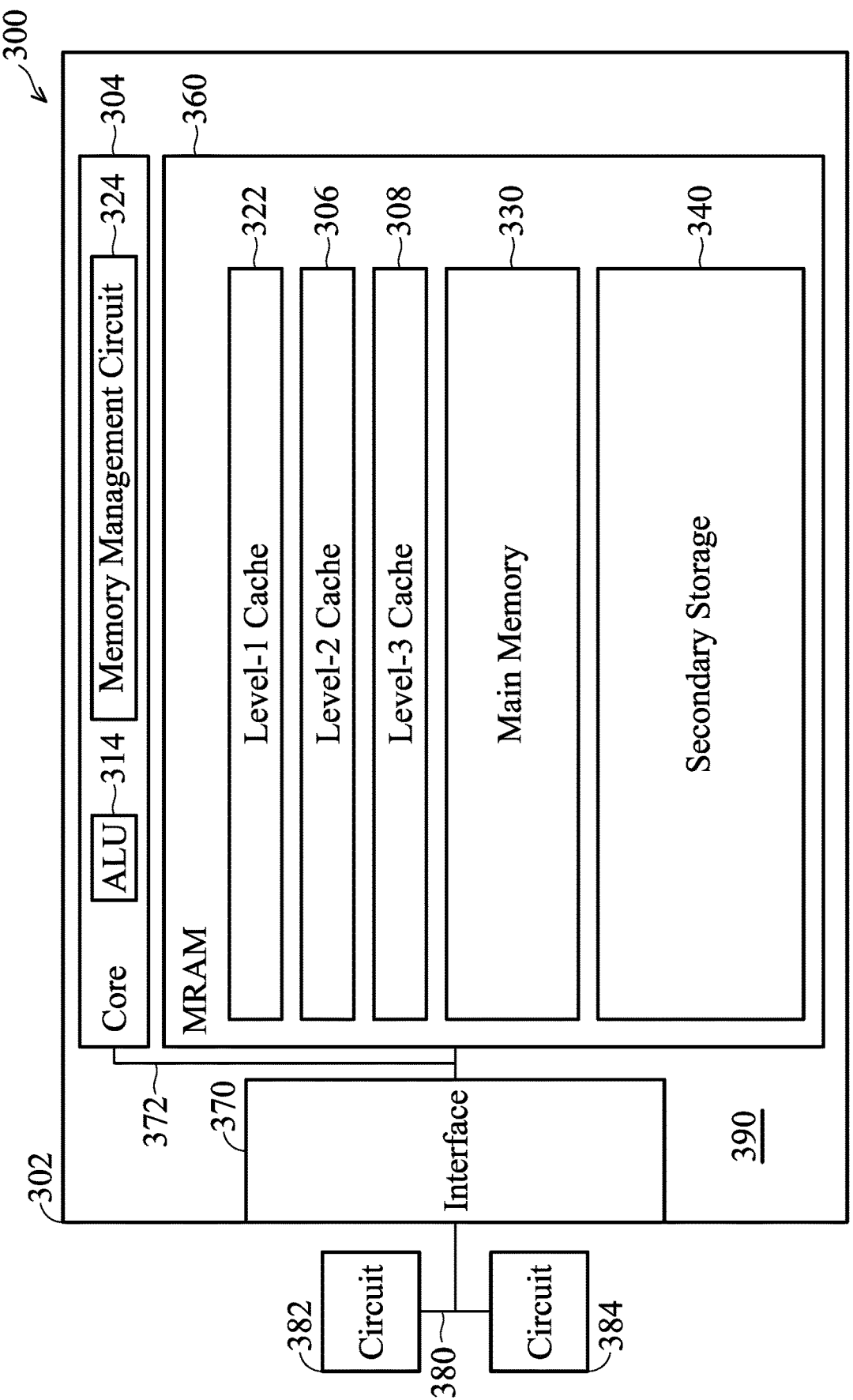
FIG. 3 illustrates a functional block diagram of a computing system in accordance with some embodiments.

FIG. 3 is a functional block diagram of a system 300 including an integrated combination processor and memory chip 302 formed in a substrate 390 according to an embodiment. The integrated circuit chip 302 comprises a processing core 304, which as illustrated includes an ALU 314 and a memory management circuit (MMU) 324, and an MRAM circuit or circuits 360 integrated into the chip 302. The processing core 304 may include various components such as one or more flip-flops, one or more scan chains, one or more registers, etc., which are omitted from FIG. 3 for ease of illustration.

The MRAM 360 includes a plurality of MRAM cells (see, e.g., MRAM cell 100 of FIG. 1 or MRAM cell 200 of FIG. 2) organized into a level-1 cache 322, a level-2 cache 306, a level-3 cache 308, a main memory 330, and secondary storage 340. The MRAM may be organized into logical or physical memories, or various combinations thereof. Any suitable type of MRAM cells may be employed (e.g., STT-MRAM, thermal-assisted switching MRAM, etc.), as well as various combinations thereof. For example, the level-1 cache 322, level-2 cache 306 and level-3 cache 308 may be implemented using one type of MRAM, and the main memory 330 and secondary storage 340 may be implemented using a different type of MRAM. The processing core 304, the MRAM 360 and an interface 370 are communicatively coupled together by an internal bus system 372 on the chip 302.

The system 300 comprises a system bus 380 which communicatively couples the chip 302 to one or more functional circuits 382, 384 (e.g., user interfaces, communication circuits, power supplies, etc.) of the system 300.

The one or more processing cores 304, in operation, generate one or more signals to control operation of the system 300, such as to provide functionality to the user of the system 300 in response to user input. Such functionality may be provided by, for example, the processing core 304 executing instructions retrieved from a memory. The memory management circuitry 324 of the processing core 304, in operation, may control storage and retrieval of data and instructions from the level-1 cache 322, the level-2 cache 306, the level-3 cache 308, the main memory 330, and the secondary storage 340 of the MRAM 360 via the internal bus 372, and from one or more memories external to the chip 302 via the one or more interfaces 370. The memory management circuitry 324 may include a plurality of addressing circuits, which may facilitate simultaneous use of the different cache levels 322, 306, 308, the main memory 330 and the secondary storage 340.

Memory management routines (e.g., cache control routines) may be employed to control the transfer of data and instructions between the level-1 cache 322, the level-2 cache 306, the level-3 cache 308, the main memory 330 and the secondary storage 340.

Embodiments of the system 300 of FIG. 3 may have fewer components than illustrated, may have more components than illustrated, may combine or separate illustrated components, and may re-arrange the illustrated components. For example, the MMU 324 may be split into multiple MMUs 324 (e.g., a first MMU 324 to control the level-1, level-2, and level-3 cache, a second MMU 324 to control the main memory 330, and a third MMU 324 to control the secondary storage 340). In another example, the MMU 324 may be part of the MRAM circuit 360 instead of the processing core 304. In another example, the MRAM circuit 360 may comprise a plurality of MRAM circuits 360. In another example, the secondary storage 340 may be implemented using a memory external to the chip 302.

In comparison with other approaches, MRAM is faster than DRAM, is denser than SRAM, is non-volatile (does not require refreshing) and has a high resistance. In addition, writing to MRAM requires less power than writing to flash. Thus, using an on-chip MRAM circuit integrated into the integrated circuit chip of the processing core instead of using SRAM, off-chip DRAM and off-chip secondary storage facilities increasing the speed of the main memory and secondary storage, reducing the area of the cache, avoiding the additional power consumption associated with refreshing of DRAM and the writing to flash, while at the same time simplifying the system by reducing the number of chips needed for the system architecture. The use of an on-chip MRAM circuit also increases system security because data and instructions can be moved between secondary storage 340 and the processing core 304 without using the system bus 380, which is external to the chip 302 and more easily accessed in an attack on the system 300.

Another advantage of using a combination processor with on-chip MRAM is increased flexibility in the system memory architecture. The use of an on-chip MRAM circuit, or on-chip MRAM circuits, which can be easily organized into separate logical or physical memories, all of which offer fast response times and low power consumption, facilitates organizing the memory in a number of different ways. Such flexibility may be complicated to implement with conventional approaches using DRAM and secondary storage external to the processor chip. Examples of alternative system architectures are illustrated in FIGS. 4 and 5.

Figure 4:
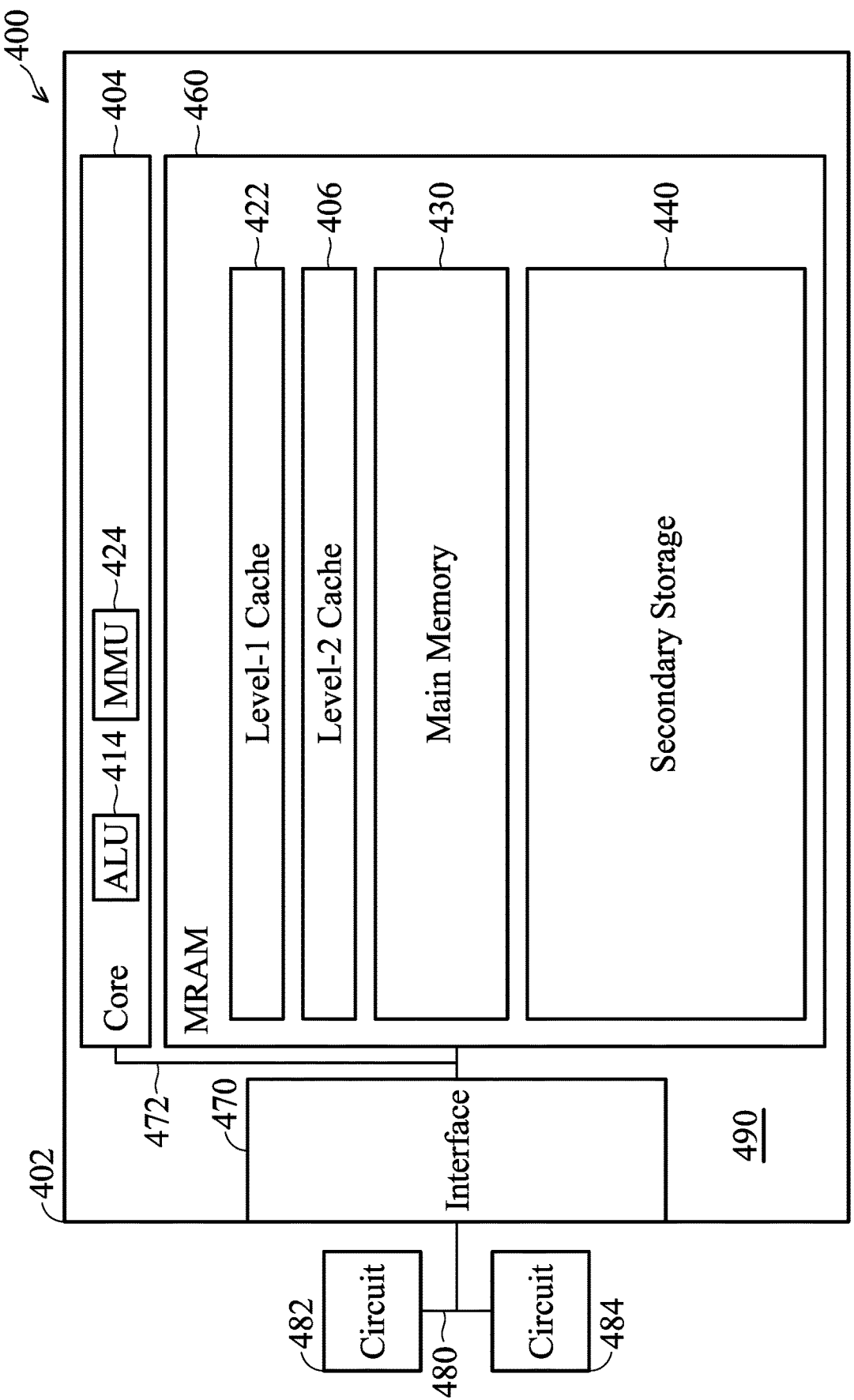
FIG. 4 illustrates a functional block diagram of a computing system in accordance with some embodiments.
Figure 5:
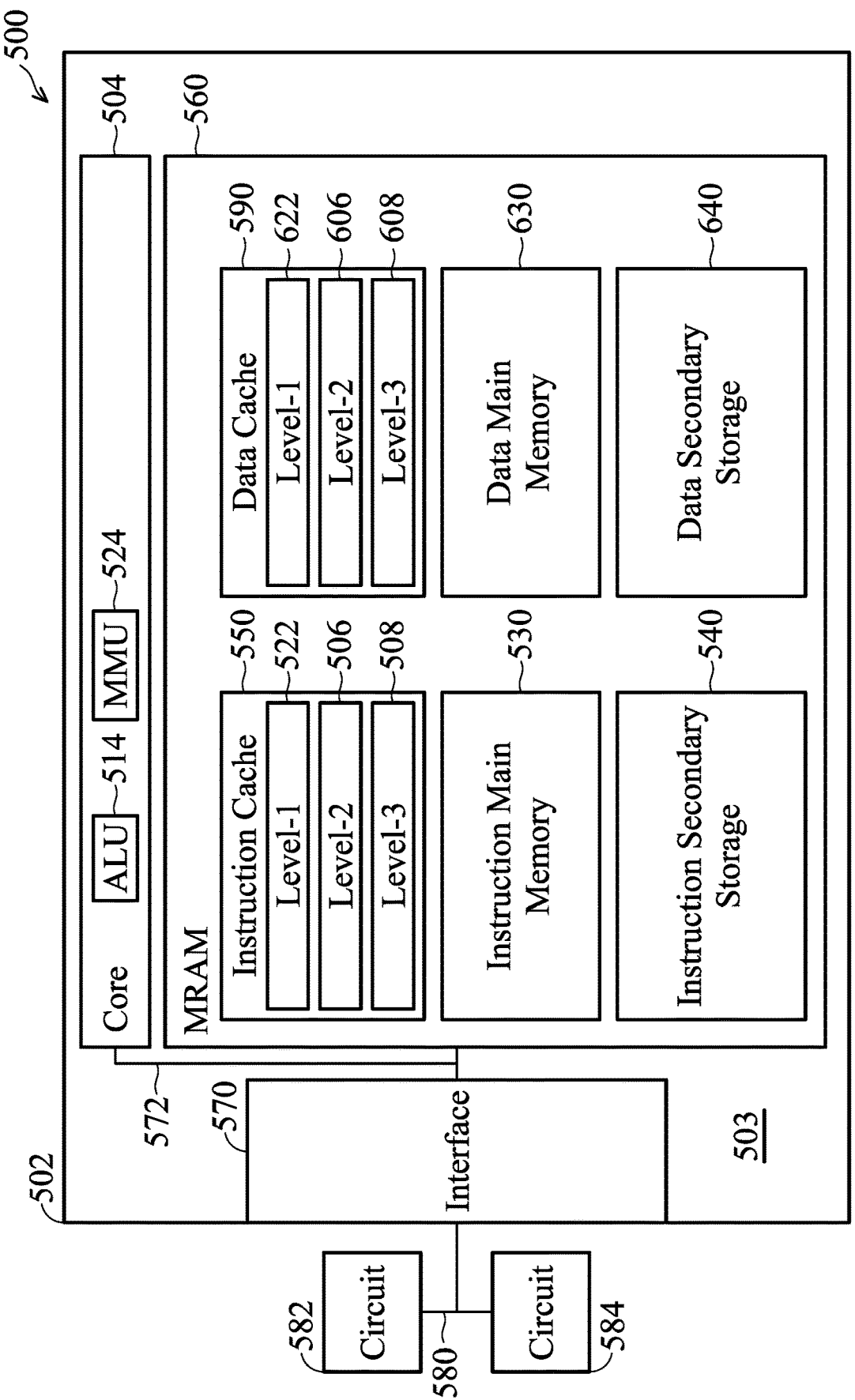
FIG. 5 illustrates a functional block diagram of a computing system in accordance with some embodiments.

FIG. 4 is a functional block diagram of a system 400 including an integrated combination processor and memory chip 402 formed in a substrate 490 according to an embodiment. The integrated circuit chip 402 comprises a processing core 404, which as illustrated includes an ALU 414, and a memory management circuit or MMU 424, and one or more MRAM circuits 460 integrated into the chip 402. The processing core 404 may include various components such as one or more flip flops, one or more scan chains, one or more registers, etc., which are omitted from FIG. 4 for ease of illustration.

The MRAM circuit 460, which includes a plurality of MRAM cells (see, e.g., MRAM cell 100 of FIG. 1, STT-MRAM cell 200 of FIG. 2) is organized into a level-1 cache 422, a level-2 cache 406, a main memory 430, and secondary storage 440. As compared to FIG. 3, the level-3 cache is omitted. The increased speed of MRAM, as compared to the speed of DRAM conventionally used for main memory, facilitates simplifying the cache organization, and may allow for the omission of, for example, the level-3 cache without significantly impacting system performance.

Some embodiments may further simplify the cache memory organization. Alternatively, in some embodiments additional cache levels may be introduced. As noted above in the discussion of FIG. 3, any suitable type of MRAM cells may be employed (e.g., spin-transfer torque MRAM, thermal-assisted switching MRAM, etc.) in the MRAM circuit, as well as various combinations thereof. The processing core 404, the MRAM 460 and an interface 470 are communicatively coupled together by an internal bus system 472 on the chip 402.

The system 400 comprises a system bus 480 which communicatively couples the chip 402 to one or more functional circuits 482, 484 (e.g., user interfaces, communication circuits, power supplies, etc.) of the system 400.

FIG. 5 is a functional block diagram of a system 500 including an integrated combination processor and memory chip 502 formed in a substrate 503 according to an embodiment. The integrated circuit chip 502 comprises one or more processing cores 504, which as illustrated include an ALU 514, and a memory management circuit or MMU 524, and an MRAM circuit 560. The one or more processing cores 504 and the MRAM circuit 560 are integrated into the chip 502. The processing core 504 may include various components such as one or more flip flops, one or more scan chains, one or more registers, etc., which are omitted from FIG. 5 for ease of illustration.

As compared to FIG. 3, the MRAM circuit 560 is organized into separate memories for instructions and for data. As illustrated, the MRAM circuit 560, which includes a plurality of MRAM cells (see MRAM cell 200 of FIG. 2) includes instruction memory organized into an instruction cache 550, which as illustrated includes a level-1 instruction cache 522, a level-2 instruction cache 506, and a level-3 instruction cache 508, an instruction main memory 530, and an instruction secondary storage 540.

The MRAM circuit 560 also includes data memory organized into a data cache 590, which as illustrated includes a level-1 data cache 622, a level-2 data cache 606, and a level-3 data cache 608, a data main memory 630, and a data secondary storage 640.

The processing core 504, the MRAM circuit 560 and an interface 570 are communicatively coupled together by an internal bus system 572 on the chip 502. The system 500 comprises a system bus 580 which communicatively couples the chip 502 to one or more functional circuits 582, 584 (e.g., user interfaces, communication circuits, power supplies, etc.) of the system 500.

Embodiments of the system 400 of FIG. 4 and embodiments of the system 500 of FIG. 5 may have fewer components than illustrated, may have more components than illustrated, may combine or separate illustrated components, and may re-arrange the illustrated components.

As noted above, MRAM is faster than DRAM, is denser than SRAM, is non-volatile (does not require refreshing) and generally has a high resistance and low power requirements. Thus, an embodiment which combines MRAM circuitry on-chip with a processing core instead of using SRAM, off-chip DRAM and off-chip secondary storage facilities increasing the speed of the main memory and secondary storage, reducing the area of the cache, avoiding the additional power consumption associated with refreshing of DRAM, while at the same time facilitating simplifying the system by reducing the number of chips needed for the system architecture. Use of a unified MRAM memory technology to implement the various memories on chip facilitates positioning components associated with the MRAM or regions thereof in close proximity to (e.g., adjacent to or stacked on) associated cells of the MRAM memory. This may facilitate reduced power consumption through leakage and interconnect loss, as well as reducing chip area and avoiding complex packaging. Other advantages of a combination processing core and on-chip MRAM include improved system security and increased flexibility in system architecture.

In comparison to other approaches, the cache memories (e.g., instruction caches 506, 508, 522, and data caches 606, 608, 622 of FIG. 5), main memories (e.g., instruction main memory 530 and data main memory 630 of FIG. 5) and the storage memories (e.g., instruction secondary storage 540 and data secondary storage 640), may be formed simultaneously in an embodiment. The caches, main memories and storage memories need not be packaged separately. In an embodiment, because the various memories may all be formed from the same type of MRAM, the density of the memory cells of the cache memories, the main memories and the storage memories may be substantially the same. In an embodiment, the various memories need not be physically separate, and a single MRAM memory area of a chip may be organized into different logical memories.

Figure 6:
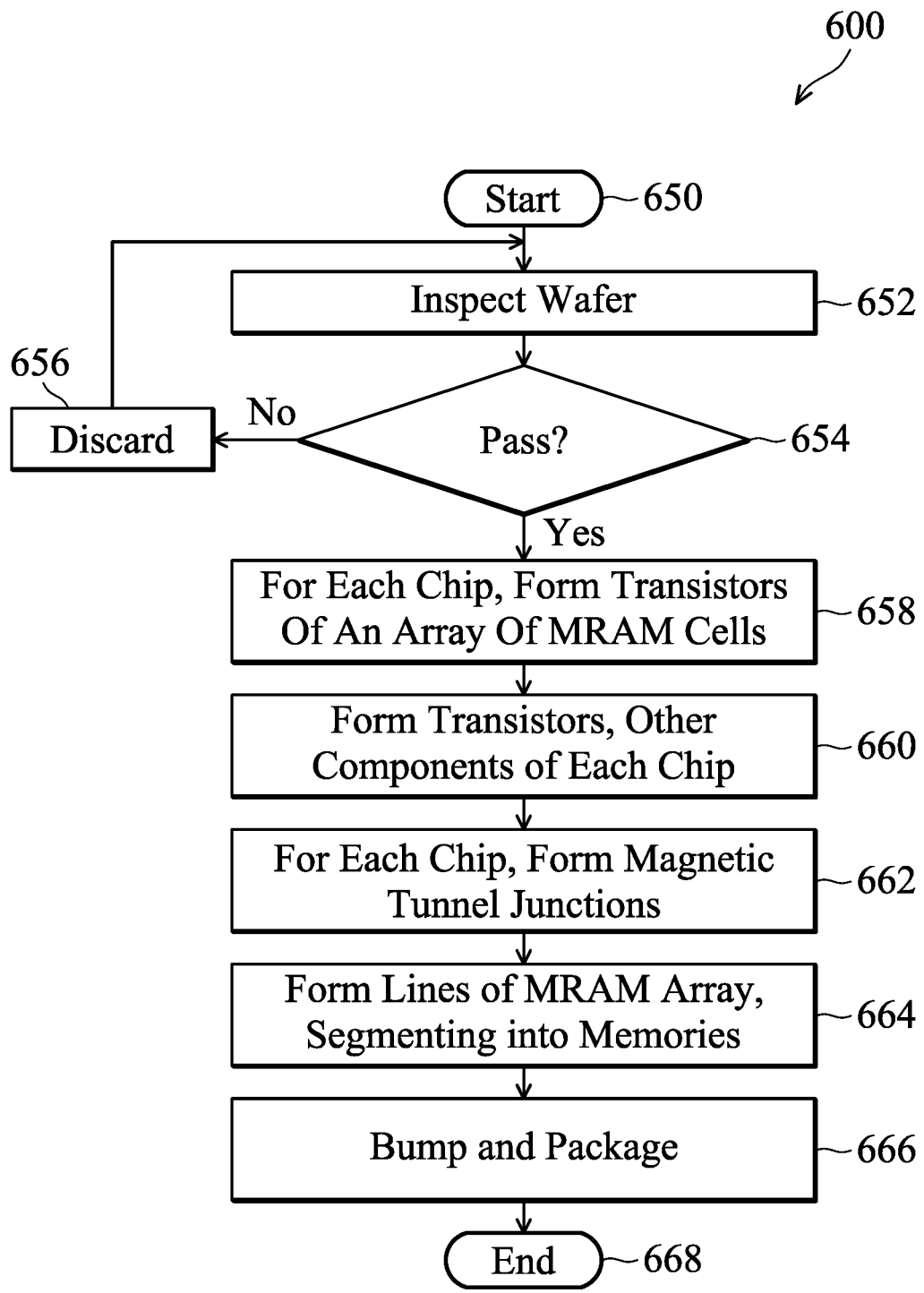
FIG. 6 illustrates a method of producing an integrated circuit in accordance with some embodiments.

FIG. 6 illustrates an embodiment of a method 600 of producing integrated combination processor and memory integrated circuit chips in a substrate of a wafer in accordance with some embodiments. The method 600 may be used, for example, to form in the substrate of the wafer a plurality of combination processor and memory integrated circuit chips such as the combination processor and memory integrated circuit chips 302 of FIG. 3, the combination processor and memory integrated circuit chips 402 of FIG. 4, the combination processor and memory integrated circuit chips 502 of FIG. 5, etc.

The method 600 starts at 650 and proceeds to 652. At 652, the wafer is inspected, and the method 600 proceeds to 654. At 654, the process determines whether the wafer has passed inspection. When it is not determined at 654 that the wafer has passed inspection, the process 600 proceeds from 654 to 656, where the wafer is discarded. In some embodiments, the method may proceed from 656 to 652 to inspect another wafer. When it is determined at 654 that the wafer has passed inspection, the process 650 proceeds from 654 to 658.

At 658, transistors of one or more arrays of MRAM cells are formed in the substrate for each chip to be formed on the wafer. For example, an array of transistors 114 of MRAM cells 100 of FIG. 1 may be formed for each chip to be formed on the wafer, an array of transistors 212 of MRAM cells 200 of FIG. 2 may be formed for each chip to be formed on the wafer, etc., and various combinations thereof. When more than one MRAM array is formed for each chip, the arrays may have a different density. In an embodiment, a single process (which may involve multiple processing acts) may be employed to form all of the transistors of the memory cells of the MRAM arrays of the wafer (and hence to form transistors of all of the memory levels of the combination processor and memory integrated circuit chips of the wafer). The multiple processing acts may include deposition, etching, cleaning, etc. The method 600 proceeds from 658 to 660.

At 660, other components are formed in the substrate for each chip to be formed on the wafer, such as the components of a processing core, ALU, memory management unit(s), interfaces, etc. (e.g., transistors, capacitors, resistors, etc.). In an embodiment, components of a memory management unit (see, e.g., memory management circuitry 754 of FIG. 12) may be formed in proximity to MRAM cells associated with the components of the memory management unit. For example, components of addressing circuitry (see Level-1 addressing circuitry 758 of FIG. 12) associated with a first cache memory implemented by a portion of a MRAM array (see first region 734 of the MRAM array 704 of FIG. 12) may be formed in close proximity or right next to MRAM cells of the portion of the MRAM array. In an embodiment, components may be stacked. For example, components of addressing circuitry may be stacked or positioned on the transistors of an associated portion of a MRAM array. The method 600 proceeds from 660 to 662.

At 662, magnetic tunnel junctions of the MRAM arrays of each chip are formed on the wafer. For example, an array of magnetic tunnel junctions 108 of MRAM cells 100 of FIG. 1 may be formed for each chip to be formed on the wafer, an array of magnetic tunnel junctions 202 of MRAM cells 200 of FIG. 2 may be formed for each chip to be formed on the wafer, etc., and various combinations thereof. When more than one MRAM array is formed for each chip, the arrays may have different magnetic tunnel junctions and different types of magnetic tunnel junctions. In an embodiment, a single process (which may involve multiple processing acts) may be employed to form all of the magnetic tunnel junctions of the memory cells of the MRAM arrays of the wafer (and hence to form magnetic tunnel junctions of all of the memory levels of the combination processor and memory integrated circuit chips of the wafer). The multiple processing acts may include deposition, etching, cleaning, etc. In an embodiment, the fixed or pinned layer (see, e.g., fixed layer 204 of FIG. 2) for all of the MRAM cells of a MRAM array or of multiple arrays may be provided using a single magnetic module formed in the substrate. The method 600 proceeds from 662 to 664.

At 664, lines (e.g., bit line 110, word write line 116 and word read line 118 of the MRAM circuits 100 of FIG. 1; bit line 210, sense line 222 and write line 230 of the MRAM circuits 200 of FIG. 2; etc.), as well as metal and connecting layers of the MRAM cells of the arrays are formed. An array of MRAM cells of a chip may be organized into separately addressable memories (e.g., with reference to FIG. 3, into the different cache levels 322, 306, 308, the main memory 330 and the secondary storage 340), by configuring the connections of the lines of the MRAM cells of the array. As mentioned above in the discussion of FIG. 3, memory management circuitry (e.g., memory management circuitry 324 of FIG. 3) may include a plurality of addressing and read circuits, which may facilitate simultaneous use of the different cache levels, main memory and secondary storage. Using MRAM in a combination processor and memory integrated circuit chip to implement the cache levels, main memory and secondary storage facilitates avoiding the need to use separate processes to form the various cache levels, main memory and secondary storage needed when different types of memory are used to implement the various memories, as well as facilitating avoiding the interconnections between chips and devices needed when separate chips and devices are used to implement the processor and various memories of various types. The method 600 proceeds from 664 to 666.

At 666, bump and packaging processing is performed on the wafer, and the wafer is separated in a plurality of combination processor and memory integrated circuit chips. The method 600 proceeds from 666 to 668, where the method 600 may terminate.

Embodiments of the method 600 of FIG. 6 may include more acts than illustrated, may include fewer acts than illustrated, may separate illustrated acts into multiple acts, may combine illustrated acts into fewer acts, and may perform illustrated acts in various orders, which may include performing illustrated acts in parallel. For example, the forming of transistors of the arrays of MRAM cells for each chip of act 658 may occur in parallel with the forming of transistors of other circuitry of the chips of act 660 (e.g., transistors of a processing core of each chip). In another example, forming of contact and metal layers of the MRAM cells of act 664 may be performed prior to forming the magnetic tunnel junctions of act 662. In another example, forming of lines of the MRAM cells of act 664 may be performed both prior to and after forming the magnetic tunnel junctions of act 662.

FIGS. 7-12 illustrate an embodiment of an integrated combination processor and memory integrated circuit chip 700 formed in a substrate of a wafer during various stages of production of the integrated circuit chip 700.

Figure 7:
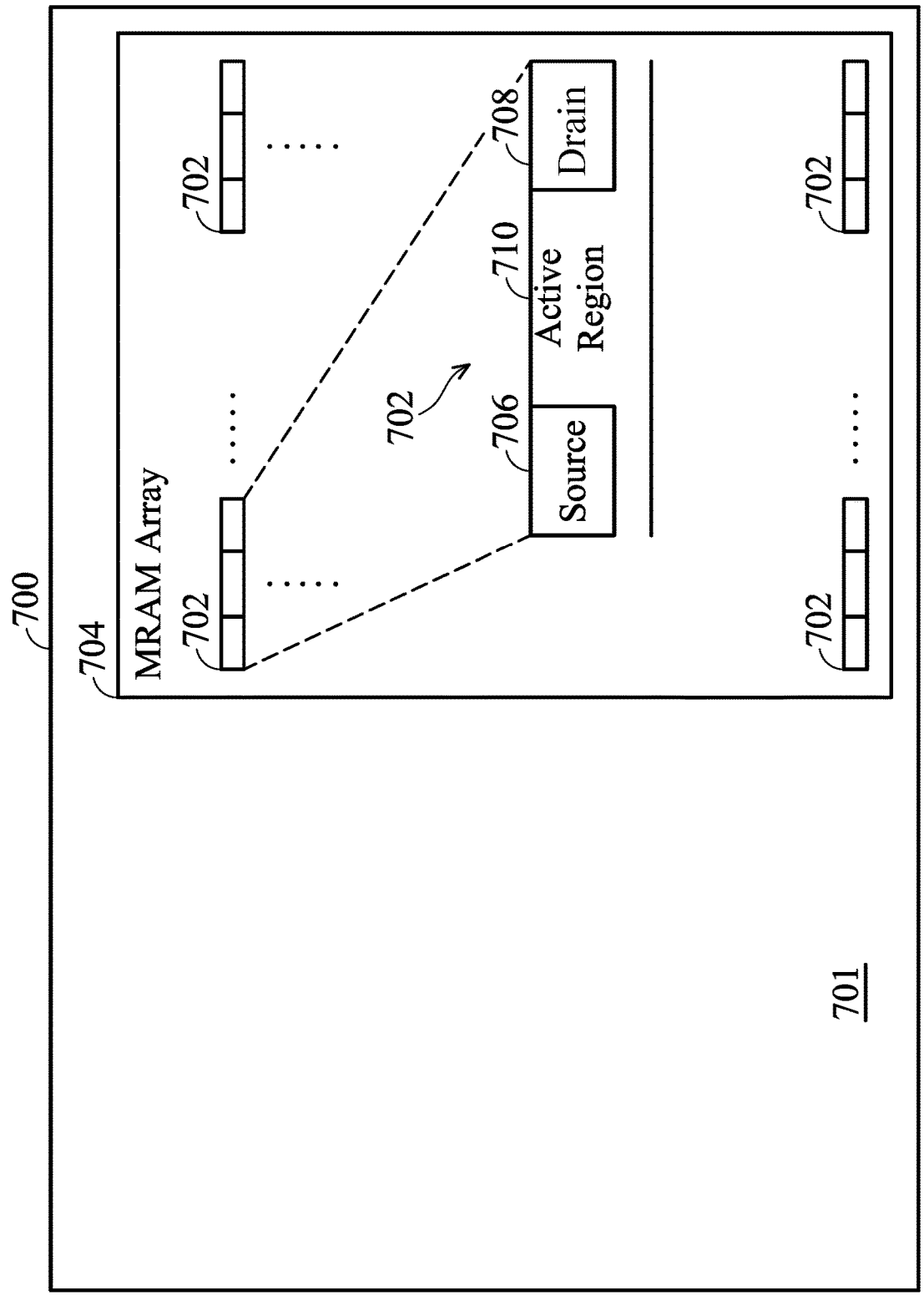
FIG. 7-12 illustrate top and cross-sectional views of an integrated circuit during various stages of a production process in accordance with some embodiments.

FIG. 7 is a simplified top view of the chip 700 after an array of transistors 702 of respective memory cells of an MRAM array 704 are formed in the substrate 701 of the chip 700. For example an array of transistors 114 of MRAM cells 100 of FIG. 1 may be formed, an array of transistors 212 of MRAM cells 200 of FIG. 2 may be formed, etc. As illustrated, the transistors 702 of the array of MRAM cells 704 have a uniform density. As illustrated, FIG. 7 includes a blown-up cross-sectional view of an embodiment of a transistor 702 of the MRAM array 704. The transistor 702 includes a source region 706, a drain region 708 and an active region 710. At this stage of production of an embodiment, the MRAM array 704 need not be segmented into separate physical sub-arrays or logical arrays, and a same procedure (e.g., the same processing acts such as depositing layers, etching, cleaning, etc.) may be employed to form each of the transistors 702 of the MRAM array 704. In some embodiments, the chip 700 may comprise a plurality of separate MRAM arrays 704, in which case a corresponding plurality of arrays of transistors 702 may be formed, either using a same procedure or using different procedures.

Figure 8:
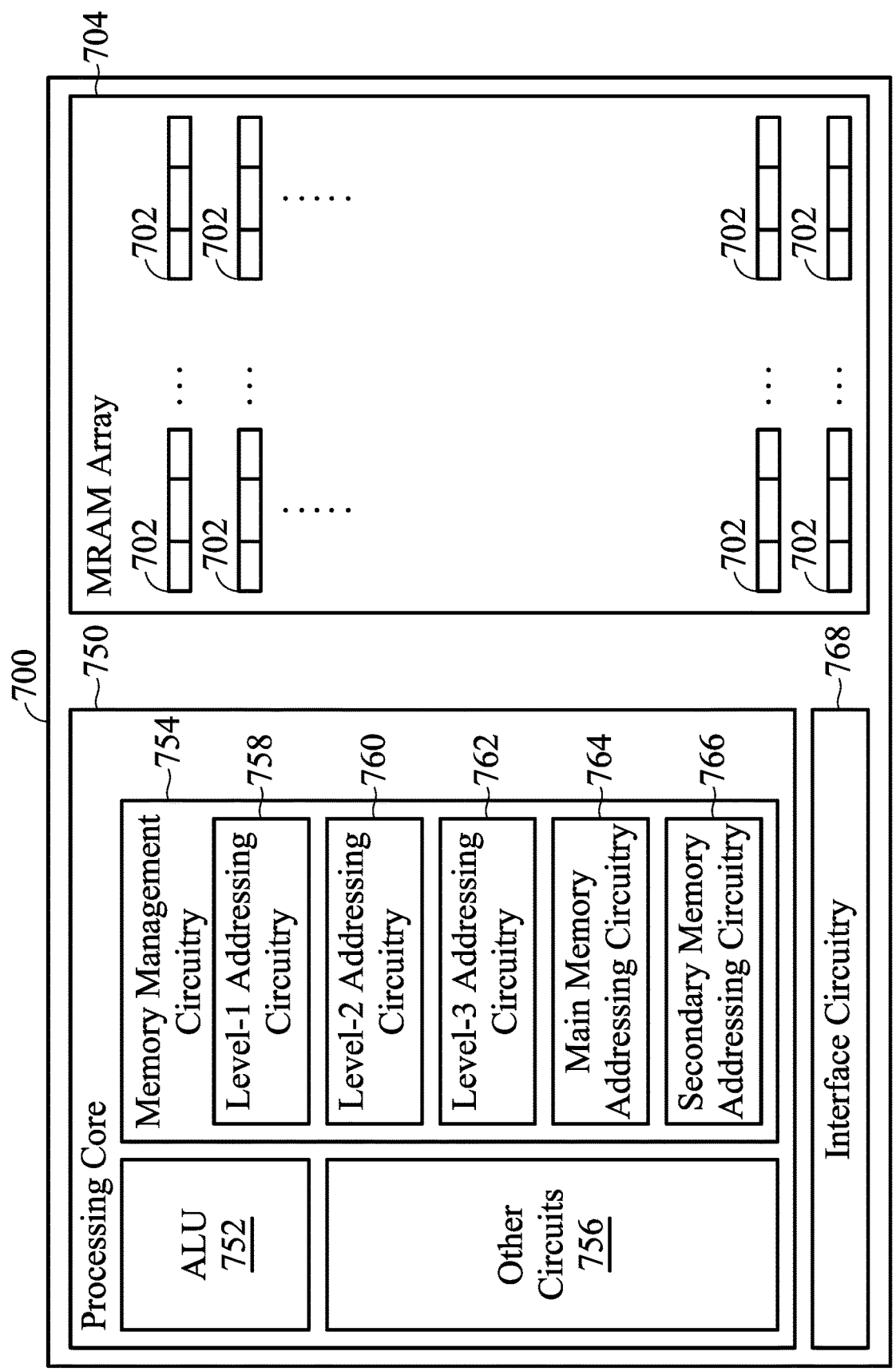

FIG. 8 is a simplified top view of the chip 700 after at least some components of a processing core 750, such as one or more transistors, capacitors, resistors, etc. (not shown), of an ALU 752, memory management circuitry 754 and other circuitry (e.g., communication control circuitry) 756 of the processing core 750, are formed in the substrate 701. As illustrated, the memory management circuitry 754 includes at least some components of cache level 1 addressing circuitry 758, cache level 2 addressing circuitry 760, cache level 3 addressing circuitry 762, main memory addressing circuitry 764, and secondary memory addressing circuitry 766. As illustrated, the chip 700 also includes at least some components of interface circuitry 768 of the chip 700. At this stage of production of an embodiment, the MRAM array 704 need not be segmented into separate physical sub-arrays or logical arrays to implement the various on-chip MRAM memories.

Figure 9:
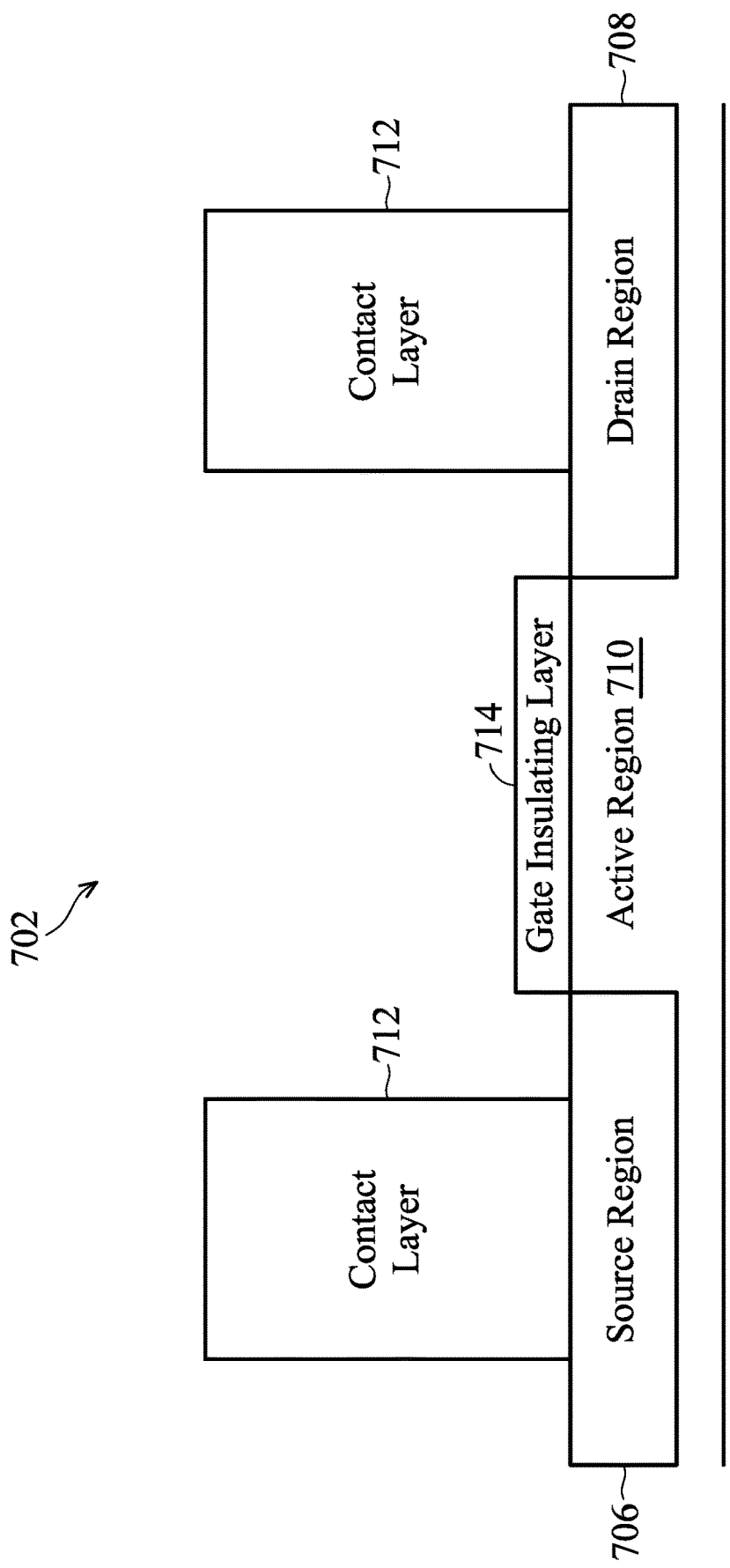

FIG. 9 is cross-sectional view of an embodiment of a transistor 702 of the MRAM array 704 of the chip 700 after contact layers 712 are deposited or formed on the source region 706 and the drain region 708, and a gate insulating layer 714 is deposited or formed on the active region 710. The contact layers 712 and the gate insulating layer 714 may typically be deposited or formed in separate acts of the production process. The depositing or forming of the contact layers 712 may occur simultaneously for all of the transistors 702 of the MRAM array 704, and the depositing or forming of the gate insulating layers 714 may occur simultaneously for all of the transistors 702 of the MRAM array 704. At this stage of production of an embodiment, the MRAM array 704 need not be segmented into separate physical sub-arrays or logical arrays to implement the various on-chip MRAM memories.

Figure 10:
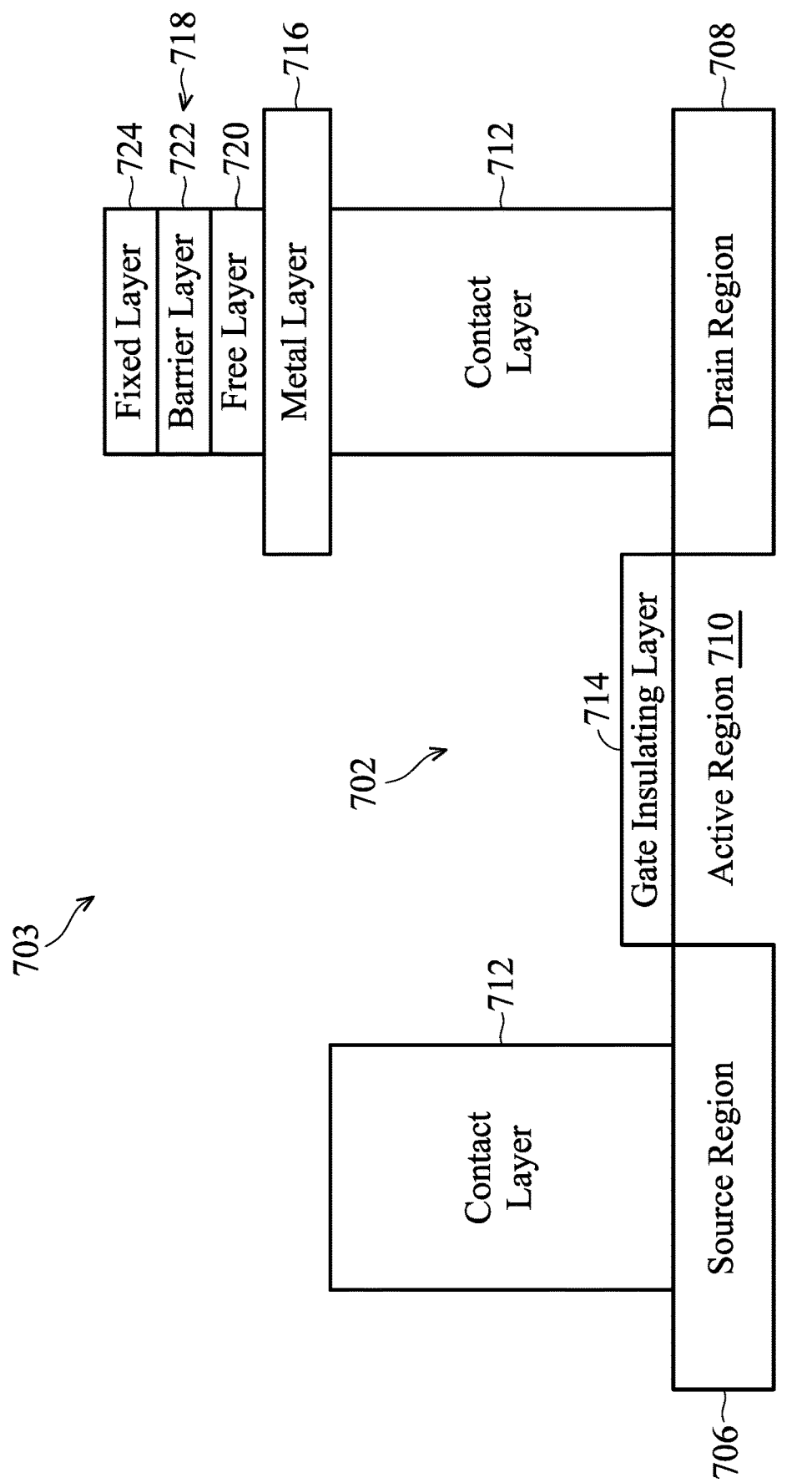

FIG. 10 is cross-sectional view of an embodiment of a transistor 702 of the MRAM array 704 of the chip 700 after a metal layer 716 and a magnetic tunnel junction 718 are deposited or formed on the transistor 702, forming a cell 703 of the MRAM array 704. The magnetic tunnel junction 718 as illustrated is a reverse connection magnetic tunnel junction and comprises a free layer 720, a tunnel barrier layer 722 and a fixed layer 724. The metal layer 716, free layer 720, tunnel barrier 722 and fixed layer 724 may typically be deposited or formed in separate acts of the production process, and may respectively be deposited or formed simultaneously for all of the transistors 702 of the MRAM array 704. In an embodiment, a single magnetic layer may be formed to provide the fixed layer 724 of all or a portion of the cells 703 of the MRAM array 704. The cells 703 of the MRAM array 704 may have a uniform density in an embodiment. At this stage of production of an embodiment, the MRAM array 704 need not be segmented into separate sets, physical sub-arrays or logical arrays of cells to implement the various on-chip MRAM memories. Other types and configurations of metal layers and magnetic tunnel junction may be employed in some embodiments. For example, a forward connection magnetic tunnel junction (see FIG. 1) may be employed.

Figure 11:
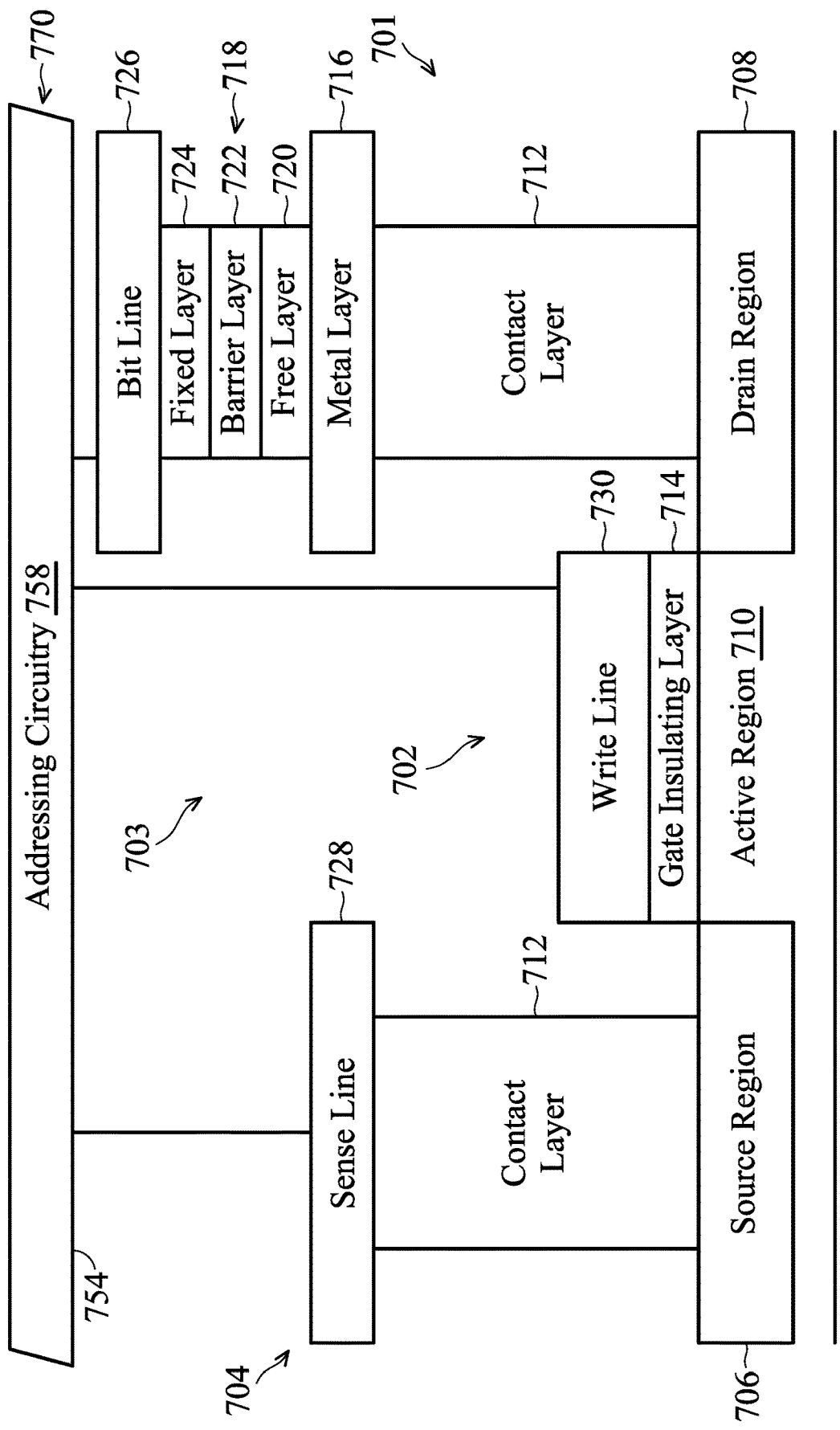

FIG. 11 is cross-sectional view of an embodiment of a cell 703 of the MRAM array 704 of the chip 700 after a bit line 726, a sense line 728 and a write line 730 are deposited or formed on the cell 703 of the MRAM array 704. The bit lines 726, sense lines 728 and write lines 730 may respectively be deposited or formed simultaneously for all or a subset of the cells 703 of the MRAM array 704. As illustrated in FIG. 11, a portion of the memory management circuitry 754, such as addressing circuitry 758 associated with the cell 703, is formed in one or more layers 770 of the substrate 701 positioned on layers forming the array 704. The addressing circuitry 758 is coupled to the bit line 726, the sense line 728 and the write line 730 of the cell 703. In an embodiment, the configurations of one or more of the bit lines 726, the sense lines 728 and the write lines 730 of the cells 703 of the MRAM array 704 configure the MRAM array 704 into a plurality of on-chip MRAM memories, as discussed in more detail in the description of FIG. 12.

Figure 12:
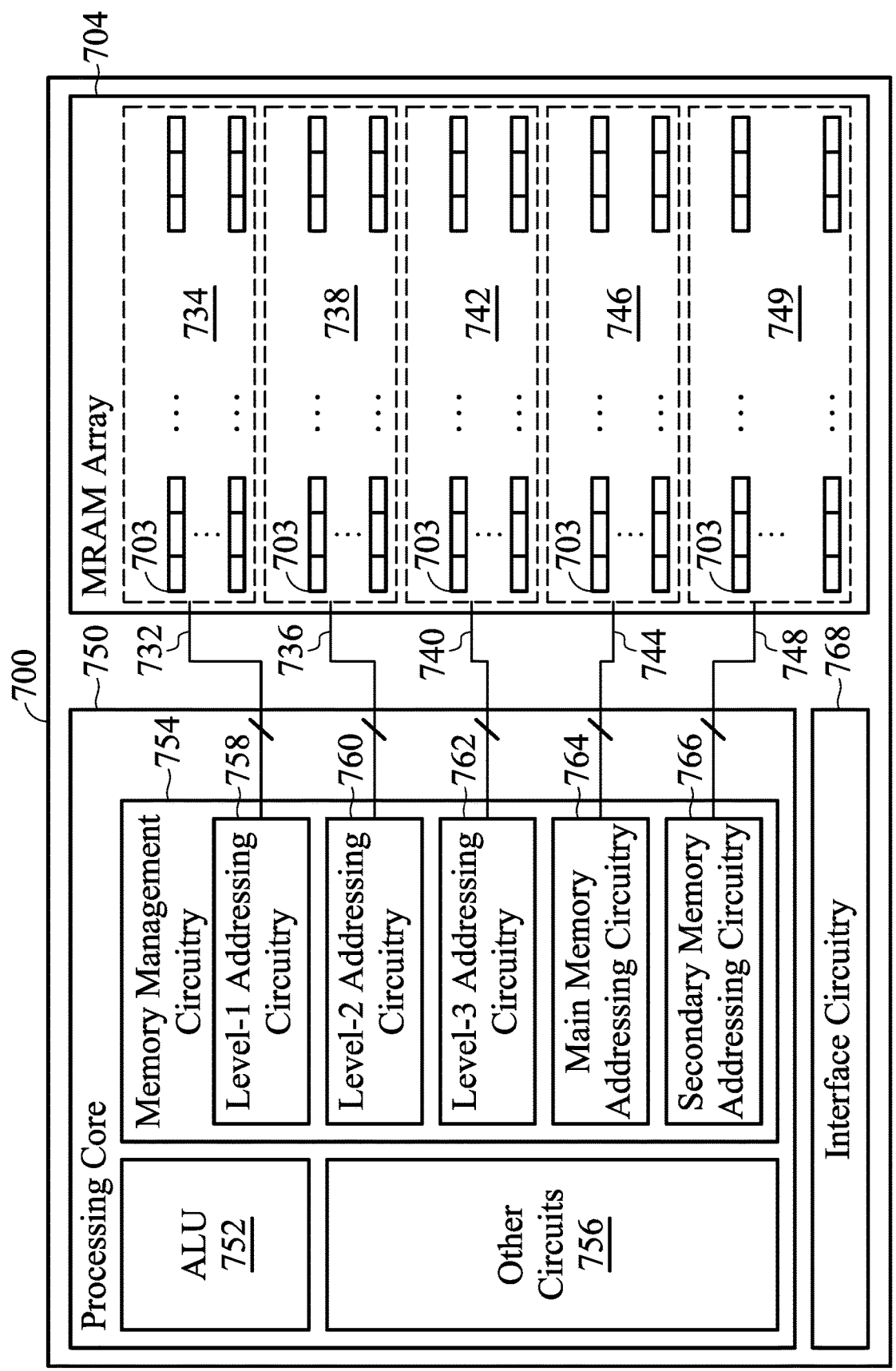

FIG. 12 is a simplified top view of an embodiment of the chip 700 after memory control lines (e.g., bit lines 726, sense lines 728 and write lines 730 of FIG. 11) are deposited or formed on the chip 700, forming a plurality of memories of the chip 700 in the MRAM array 704. The configurations of one or more of the memory control lines of the cells 703 of the MRAM array 704 configure the MRAM array 704 into a plurality of on-chip MRAM memories. As illustrated, a first set of memory control lines 732 couple cache level 1 addressing circuitry 758 to a first set of cells 703 of a first region 734 of the MRAM array 704 corresponding to a level 1 cache memory, a second set of memory control lines 736 couple cache level 2 addressing circuitry 760 to a second set of cells 703 of a second region 738 of the MRAM array 704 corresponding to a level 2 cache memory, a third set of memory control lines 740 couple cache level 3 addressing circuitry 762 to third set of cells 703 of a third region 742 of the MRAM array 704 corresponding to a level 3 cache memory, a fourth set of memory control lines 744 couple main memory addressing circuitry 764 to a fourth set of cells 703 of a fourth region 746 of the MRAM array 704 corresponding to a main memory, and a fifth set of memory control lines 748 couple secondary storage addressing circuitry 766 to a fifth set of cells 703 of a fifth region 749 of the MRAM array 704 corresponding to a secondary storage memory. The memory control lines are used to control and perform read, write and erase operations on the plurality of memories. Other configurations of addressing circuitry, sets of memory control lines and sets of cells and regions of the MRAM array 704 may be employed, as well as multiple on-chip MRAM arrays. Use of a plurality of addressing circuits and sets of memory control lines may facilitate simultaneous use of different cache levels, main memory and secondary storage, as well as use of different clocks with the various memories. As discussed above, the addressing circuits may be positioned in close proximity to corresponding regions of the MRAM array 704 (e.g., adjacent to or positioned or stacked on). Positioning the addressing circuits in close proximity to corresponding regions facilitates using shorter control lines, which may facilitate reducing power consumption, leakage and area requirements. Some embodiments may employ common addressing circuitry.

In an embodiment, a device includes an integrated circuit chip. At least one processing core and at least one magnetoresistive random access memory (MRAM) circuit are integrated into the chip. The at least one MRAM circuit includes a plurality of MRAM cells. In operation, the at least one MRAM circuit implements at least one cache memory and at least one main memory.

In an embodiment, a system includes an integrated circuit chip. One or more processing cores and magnetoresistive random access memory (MRAM) circuitry are integrated into the chip. The MRAM circuitry includes a plurality of MRAM cells organized into a plurality of memories. The memories include at least one cache memory and at least one main memory. The system includes a functional circuit and a system bus. The system bus, in operation, communicatively couples the functional circuit to the integrated circuit chip.

In an embodiment, a method of manufacturing an integrated circuit comprises forming one or more processing cores and one or more MRAM cell arrays of an integrated circuit chip in a substrate. The one or more MRAM arrays are organized into a plurality of memories including at least one cache memory and at least one main memory.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
an integrated circuit chip, the integrated circuit chip including:
at least one processing core integrated into the chip;
at least one magnetoresistive random access memory (MRAM) circuit integrated into the chip and communicatively coupled to the at least one processing core, the at least one MRAM circuit including a plurality of MRAM cells, wherein the at least one MRAM circuit, in operation, implements,
at least one cache memory via a first region of the plurality of MRAM cells; and
at least one main memory via a second region of the plurality of MRAM cells;
a first addressing circuit positioned in close proximity to the first region of the plurality of MRAM cells and coupled to the first region of the plurality of MRAM cells via a first set of memory control lines, the first addressing circuit corresponding to the first region of the plurality of MRAM cells; and
a second addressing circuit positioned in close proximity to the second region of the plurality of MRAM cells and coupled to the second region of the plurality of MRAM cells via a second set of memory control lines, the second addressing circuit corresponding to the second region of the plurality of MRAM cells, and the second addressing circuit different from the first addressing circuit,
wherein a MRAM cell of the plurality of MRAM cells includes a fixed layer, a free layer and a tunnel barrier layer between the fixed layer and the free layer, the free layer coupled to a first source or drain terminal of a control transistor through a metal layer, the fixed layer coupled to a bit line; and
wherein a second source or drain terminal of the control transistor is coupled to a sense line and a gate of the control transistor is coupled to a write line.

2. The device of claim 1, comprising:
at least one memory management circuit (MMU) integrated into the chip, wherein at least a portion of the at least one MMU is positioned on at least a portion of the at least one MRAM circuit.

3. The device of claim 1 wherein the at least one MRAM circuit, in operation, implements at least one secondary storage memory.

4. The device of claim 1, comprising:
a chip interface; and
an on-chip bus system, which, in operation, communicatively couples together the at least one processing core, the at least MRAM circuit and the interface.

5. The device of claim 1 wherein the at least one cache memory includes a level-1 cache, a level-2 cache and a level-3 cache.

6. The device of claim 1 wherein the at least one cache memory includes an instruction cache and a data cache.

7. The device of claim 1 wherein the at least one cache memory and the at least one main memory have a same MRAM cell density.

8. The device of claim 1, wherein the first addressing circuit is stacked on the first region of the plurality of MRAM cells, and the second addressing circuit is stacked on the second region of the plurality of MRAM cells.

9. A system, comprising:
an integrated circuit chip, the integrated circuit chip having:
a processing core integrated into the chip;
magnetoresistive random access memory (MRAM) circuitry integrated into the chip, the MRAM circuitry including a plurality of MRAM cells organized into a plurality of MRAM memories, including at least one cache memory, and at least one main memory;
a first addressing circuit positioned in close proximity to a first region of the plurality of MRAM cells and coupled to the first region of the plurality of MRAM cells via a first set of memory control lines, the first region of the plurality of MRAM cells implementing the at least one cache memory, the first addressing circuit corresponding to the first region of the plurality of MRAM cells; and
a second different addressing circuit positioned in close proximity to the second region of the plurality of MRAM cells and coupled to the second region of the plurality of MRAM cells via a second set of memory control lines, the second region of the plurality of MRAM cells implementing the at least one main memory, the second addressing circuit corresponding to the second region of the plurality of MRAM cells, and the second addressing circuit different from the first addressing circuit;
a functional circuit; and
a system bus, which, in operation, communicatively couples the functional circuit to the integrated circuit chip,
wherein a MRAM cell of the plurality of MRAM cells includes a fixed layer, a free layer and a tunnel barrier layer between the fixed layer and the free layer, the free layer coupled to a first source or drain terminal of a control transistor through a metal layer, the fixed layer coupled to a bit line; and
wherein a second source or drain terminal of the control transistor is coupled to a sense line and a gate of the control transistor is coupled to a write line.

10. The system of claim 9 wherein the first addressing circuit is positioned on the first region of the plurality of MRAM memories, and the second addressing circuit is positioned on the second region of the plurality of MRAM memories.

11. The system of claim 9 wherein the at least one cache memory includes a level-1 cache, a level-2 cache and a level-3 cache and the plurality of memories into which the plurality of MRAM cells are organized includes a secondary storage memory.

12. The system of claim 11 wherein the MRAM circuitry comprises at least two types of MRAM cells.

13. The system of claim 9, comprising:
a plurality of sets of memory control lines integrated into the chip, each set of memory control lines being coupled between the processing core and a respective memory of the plurality of MRAM memories.

14. The system of claim 9 wherein the plurality of MRAM cells of the MRAM circuitry have a uniform cell density.

15. A method of manufacturing an integrated circuit, comprising:
  forming one or more processing cores of an integrated circuit chip in a substrate; and
    forming one or more magnetoresistive random access memory (MRAM) arrays of the integrated circuit chip in the substrate, the one or more MRAM arrays being organized into a plurality of memories including at least one cache memory and at least one main memory;
    forming a first addressing circuit positioned in close proximity to a first region of the one or more MRAM arrays and coupled to the first region of the one or more MRAM arrays via a first set of memory control lines, the first region of the one or more MRAM arrays implementing the at least one cache memory, the first addressing circuit corresponding to a second region of the one or more of MRAM arrays; and
    forming a second different addressing circuit positioned in close proximity to the second region of the one or more MRAM arrays and coupled to the second region of the one or more MRAM arrays via a second set of memory control lines, the second region of the one or more MRAM arrays implementing the at least one main memory, the second addressing circuit corresponding to the second region of the one or more of MRAM arrays, and the second addressing circuit different from the first addressing circuit,
    wherein a MRAM cell of the plurality of MRAM cells includes a fixed layer, a free layer and a tunnel barrier layer between the fixed layer and the free layer, the free layer coupled to a first source or drain terminal of a control transistor through a metal layer, the fixed layer coupled to a bit line; and
    wherein a second source or drain terminal of the control transistor is coupled to a sense line and a gate of the control transistor is coupled to a write line.

16. The method of claim 15 wherein the forming one or more MRAM arrays comprises simultaneously forming a plurality of MRAM arrays and wherein the plurality of MRAM arrays have a same MRAM cell density.

17. The method of claim 15, comprising forming a plurality of sets of memory control lines of the chip in the substrate, a first set of the memory control lines coupling the one or more processing cores to MRAM cells of the at least one cache memory and a second set of the memory control lines coupling the one or more processing cores to MRAM cells of the at least one main memory.

18. The method of claim 17, comprising forming addressing circuitry on MRAM cells of the at least one cache memory, the addressing circuitry being coupled to the first set of memory control lines.

19. The method of claim 15, wherein the first addressing circuit is formed to be stacked on the first region of the one or more MRAM arrays, and the second addressing circuit is formed to be stacked on the second region of the one or more MRAM arrays.

* * * * *